United States Patent [19]
Biebl

[11] Patent Number: 5,700,379
[45] Date of Patent: Dec. 23, 1997

[54] METHOD FOR DRYING MICROMECHANICAL COMPONENTS

[75] Inventor: Markus Biebl, Augsburg, Germany

[73] Assignee: Siemens Aktiengesellschaft, Munich, Germany

[21] Appl. No.: 601,612

[22] Filed: Feb. 14, 1996

[30] Foreign Application Priority Data

Feb. 23, 1995 [DE] Germany ............... 195 06 404.6

[51] Int. Cl.$^6$ .............. H01L 21/306; B01D 7/00; B01D 12/00
[52] U.S. Cl. ............... 216/2; 216/90; 438/747; 23/294 R
[58] Field of Search ................... 216/2, 11, 83

[56] References Cited

U.S. PATENT DOCUMENTS

| | | |
|---|---|---|
| 5,013,693 | 5/1991 | Guckel et al. ............ 437/248 |
| 5,258,097 | 11/1993 | Mastrangelo ............ 156/644 |
| 5,403,665 | 4/1995 | Alley et al. ............ 428/447 |

FOREIGN PATENT DOCUMENTS

| | | |
|---|---|---|
| 0 403 962 | 12/1990 | European Pat. Off. |
| 0 631 190 | 12/1994 | European Pat. Off. |
| 2 218 020 | 9/1974 | France |
| US/90/00625 | 2/1990 | WIPO |

OTHER PUBLICATIONS

Canham, L. T. et al., "Luminescent Anodized Silicon Aerocrystal Networks Prepared by Supercritical Drying," Letters to Nature, v. 368, pp. 133–135, Mar. 10, 1994.

Legtenberg, R. et al., "Stiction of Surface Micromachined Structures after Rinsing and Drying: Model and Investigation of Adhesion Mechanisms," Sensors and Actuators A, 43, pp. 230–238, 1994.

Photoresist-Assisted Release of Movable Microstructures—Kim et al Jpn. J. Appl. Phys., vol. 32 (1993) pp. L1642–L1644.

Stiction of surface micromachined structures after rinsing and drying: model and investigation of adhesion mechanisms—Sensors and Actuators A. 43 (1994) 230–238.

Letters to Nature—vol. 368 10 Mar. 1994.

Thin Solid Films 255 (1995) 115–118.

*Primary Examiner*—R. Robert Breneman
*Assistant Examiner*—Michael E. Adjodha
*Attorney, Agent, or Firm*—Hill, Steadman & Simpson

[57] ABSTRACT

A micromechanical structure is etched on a component that has been introduced into a container having a plurality of inlet and discharge openings. The liquid etchant is displaced downwardly through a liquid discharge at the underside of the container by admitting water through the liquid inlet at the upper side, whereby no turbulence occurs in the liquid flow. The water employed as a rinsing agent is displaced by a liquid having a lower density such as, for example, ethanol or acetone. Finally, a liquefied gas, for example liquid carbon dioxide, is admitted via the liquid, this gas is evaporated by heating the container above the critical temperature, the pressure in the inside of the container is reduced to the ambient air pressure by opening a gas discharge, and the component is removed from the container through a sluice or lock.

15 Claims, 1 Drawing Sheet

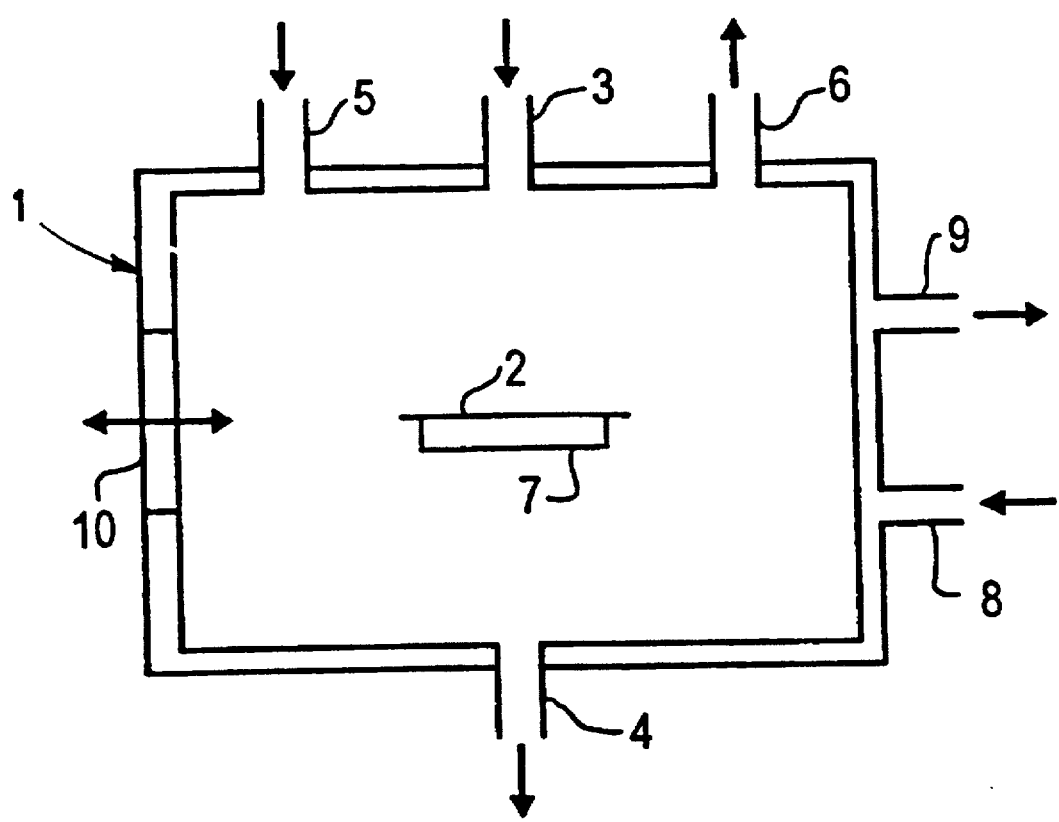

METHOD FOR DRYING MICROMECHANICAL COMPONENTS

BACKGROUND OF THE INVENTION

Micromechanical components such as, for example, movable parts of sensors and actuators are usually wet-chemically etched free during manufacture in order to separate them from the remaining part of the component. The etching fluid must be subsequently removed. This first occurs in that the etching fluid is rinsed from the component with a different liquid. This rinsing liquid must be subsequently removed by drying. The problem thereby arises that the micromechanical part approaches the solid surface during the gradual drying of this liquid and ultimately sticks thereto. Moreover, turbulences can occur in the rinsing liquid that deflect the sensitive micromechanical part and likewise lead to a sticking. Methods wherein the components are successively processed in various containers (receiving vessels) were therefore previously used for the manufacture. In order to prevent the aqueous liquid from immediately running off from the water-repellant surface of the component after the etching (which, for example, occurs with hydrofluoric acid (HF)—thus producing an immediate sticking of the movable components) a wetting liquid must be added in the first step of the method. A plurality of individual method steps wherein the component is respectively brought from one recipient into the next and wherein various liquids are utilized are therefore required in the method. Each of these transfers involves the formation of turbulences in the respective liquids located on the component, these respectively harboring the risk that the movable component sticks on the component. The liquid applied last is dried in that this liquid is completely converted into the gaseous aggregate state (phase). This can occur with a direct phase transition from the liquid into the gaseous aggregate state, or the liquid is caused to solidify and is subsequently directly converted by sublimation of the solid into the gaseous aggregate state.

Above what is referred to as the critical temperature, a gas can no longer be condensed by an increase in the pressure. Above this critical temperature thus a uniformly composed chemical substance is completely in the gaseous aggregate state (phase). A complete drying, i.e. a complete evaporation of a liquid can thus be achieved in that only the temperature is raised above the critical temperature independent of the prevailing pressure. In the volume-pressure-phase diagram (pV diagram), one of the isotherms in the curve set parameterized with the temperature is distinguished as the limit of that range in which no condensation can occur by increasing the pressure given a fixed temperature. The liquid can thus be completely dried off in that the temperature is raised above this value that determines this isotherm. Since this isotherm proceeds through what is referred to as the "critical point", this drying method is also referred to as critical point drying. Given drying by sublimation of a chemical (conversion from the solid into the gaseous phase), the liquid that is located on the component is first caused to solidify by lowering the temperature; subsequently, the pressure is reduced to such an extent that, potentially given a simultaneous increase in temperature, the solid chemical sublimates into a gas. Given the described method, only respective individual chips can be processed, but not entire semiconductor wafers with a plurality of components.

SUMMARY OF THE INVENTION

An object of the present invention is to specify a method for separating and drying wet-chemically etched, micromechanical components wherein the problem of sticking does not occur.

According to the method of the invention for separating micromechanical function elements on a semiconductor component, a micromechanical function element is manufactured and wet-chemically etched free in an interior of a receiving vessel or container. A liquid etching chemical employed for that purpose is bled from the container and a liquid is emitted into the container as a rinsing agent. The liquid admitted in the preceding step is bled from the container and a liquid having a lower density is admitted into the container. The previous step is then repeated as needed. The liquid admitted last is completely converted into the gaseous aggregate state by changing the pressure and/or temperature in the interior of the container. The pressure in the container is matched to an outside air pressure and the triad component is removed from the container.

In the method of the invention, both the etching for structuring and separating of the micromechanical components as well as the dehydration and the drying occur in the same receiving vessel (container). A formation of turbulences, as may be anticipated when changing vessels, can be avoided in this way. In this method of the invention, such turbulences are avoided in that liquids having lower density than that of the respectively preceding liquid are successively utilized. These liquids are admired into the receiving vessel from above, so that the liquid with higher density previously located in the container can be bled downward from the container without forming turbulence.

BRIEF DESCRIPTION OF THE DRAWINGS

The drawing shows in cross-sectional view from the side a container for performing the method of separating the micromechanical function elements on a semiconductor component according to the invention.

DESCRIPTION OF THE PREFERRED EMBODIMENTS

A container suitable for this method is schematically shown in the drawing. The component 2 to be dried is located in the inside of the container 1 and a heater or a cooling unit 7 can be potentially provided for the component 2. The sluice or lock 10 for inserting into the container the chips or wafers to be processed is located in the wall of the container. Openings for the admission of a liquid (liquid inlet 3), for the admission of a condensed gas (fluid gas inlet 5), and a gas outlet opening 6 are located in the upper wall of the container. A space which is rinsed by a liquid (for example, water) and which can be utilized as a heater or as a cooler, is located in the wall. An inlet opening 8 and a discharge opening 9 provided therefor are located at the side wall in this example. An opening for bleeding liquids off (liquid outlet) is situated at the underside.

The component to be processed and having a coating provided for a micromechanical component is introduced through the sluice or lock 10 into the inside of the container. The sluice or lock is closed and a liquid etchant, for example an aqueous solution containing hydrogen fluoride (hydrofluoric acid, HF) is admitted through a liquid inlet 3. The intended structuring of the micromechanical component is thus wet-chemically implemented. The etching liquid, i.e. HF in an aqueous solution in this example, is then bled off downward through this liquid discharge 4. At the same time, deionized water, for example, is introduced through the liquid inlet, this displacing the etching chemical downwardly. Water has a lower density than the hydrofluoric acid employed for the etching.

In the general case, a liquid that has a lower density at the established temperature than the liquid used for the etching is employed as a rinsing liquid in this method. What is achieved in this way is that, given a simultaneous discharge of the liquid to be replaced and admission of the replacement liquid, a stratification of the liquid wherein the more dense liquid is present at the bottom and the less dense liquid is present at the top is always present in the inside of the container. Given an adequate difference in density, eddying, i.e. turbulence in the liquid, can be prevented, so that the liquid previously situated in the container can flow off downwardly in an essentially laminar flow. The micromechanical part that has been etched free is then not deflected or is hardly deflected, so that it does not come into contact with the rest of the component.

The micromechanical component is rinsed with this introduced liquid, deionized water in this example, in order to completely remove the etchant. Subsequently, a liquid that has a lower density than water is admitted into the recipient through the liquid admission 3. For example, ethanol (density of 789 kg/m$^3$ at 20° C.) or acetone (density of 791 kg/m$^3$ at 20° C.) can be employed therefor. These liquids can be replaced as warranted by further liquids with respectively decreasing density. When work is carried out at temperatures significantly below 0° C., ethanol can also be replaced by acetone that has a lower density than ethanol at very low temperatures. Another alcohol such as, for example, methanol can be employed, for example, instead of ethanol.

Finally, a liquid is admitted that is provided for the purpose of being completely evaporated by raising the temperature, i.e. for being converted from the liquid to the gaseous aggregate state. Liquid carbon dioxide, for example, can be employed for this purpose, this being admitted into the container from a gas cylinder connected to the liquid inlet 5. The liquid previously introduced into the container is selected such that it has a higher density than the liquefied gas introduced last. In the case of liquid carbon dioxide, the previously employed liquid can, for example, be ethanol or acetone, as indicated. After all openings of the container have been closed, the liquid carbon dioxide is heated above the critical temperature by an increase in temperature. This heating can occur, for example, with hot water that is conducted through the volume located in the wall of the container via the inlet opening 8 and the discharge opening 9. The critical temperature of carbon dioxide lies at 30.98° C. When the temperature of the carbon dioxide lies above this value, the carbon dioxide is ultimately completely evaporated, i.e. is only present in the gaseous phase. The gas outlet opening 6 can then be opened in order to slowly lower the pressure in the inside of the container to the surrounding air pressure. The sluice or lock is opened and the dried component is removed from the container.

Some other gas that can be admitted as a liquid and that can be heated above the critical point within the framework of the conditions provided for the method (pressure and temperature that can be reached) can be employed instead of carbon dioxide. For example, a halogen carbon compound (for example, a Freon) is employable. The critical temperature of CClF$_3$ lies at 29° C., so that this Freon can, for example, be employed very well instead of carbon dioxide.

As an alternative to drying by direct conversion of the liquid employed last from the liquid state into the gaseous aggregate state, the liquid can also be solidified first and then can be brought directly from the solid into the gaseous aggregate state. Alternative drying processes that are possible within the scope of the inventive method can potentially occur in alternating fashion in the same recipient. Given drying by sublimation, a molten chemical, i.e. a chemical substance that is solid under normal conditions, is preferably admitted last. Upon employment, for example, of the built-in water heater, the recipient is thereby kept at elevated temperature compared to the ambient temperature so that this chemical remains in the liquid aggregate state. Given a suitable selection of this chemical, the chemical can be solidified with a comparatively slight temperature reduction, so that the micromechanical component to be dried is surrounded by a chemical substance in its solid aggregate state. The phase transition from the solid into the gaseous aggregate state (sublimation) can be achieved in that the pressure in the container is adequately reduced. For this purpose, for example, a vacuum pump can be connected to the gas outlet opening 6 of the container. The pressure must be lowered to such an extent that the phase transition from the solid into the gaseous phase occurs directly. When the pressure is adequately low, this phase transition can be promoted by an additional increase in temperature. When the solid chemical substance has completely sublimated, i.e. changed into the gaseous aggregate state, and has been pumped off through the gas outlet opening 6, the pressure prevailing in the container can be matched to the outside air pressure. It is then possible to remove the processed component from the container through the sluice or lock. For example, dichlorobenzene, tert-butanol and cyclohexane or a water/alcohol mixture as well come into consideration as the chemical to be sublimated. The temperatures and pressures are to be matched to the physical properties of the chemical substance respectively employed. All chemical substances melting point of which lie in the proximity of room temperature and that can be sublimated given a moderate reduction in pressure seem especially well-suited for this last-described alternative method step.

Given this method, micromechanical components on components can be etched free and dried with a high yield of usable components even at the wafer level, i.e. when the components are still situated on a semiconductor wafer. Given a slow exchange of the various liquids with decreasing density, turbulence can be reduced to such an extent that the flow in the liquid remains adequately laminar in order to avoid deflections of the movable parts and thus sticking. Furthermore, the method can be largely automated, this enhancing the dependability, lowering costs and assuring an extremely well-reproducible implementation. The method can therefore be used on a large scale for industrial production.

Although various minor changes and modifications might be proposed by those skilled in the art, it will be understood that my wish is to include within the claims of the patent warranted hereon all such changes and modifications as reasonably come within my contribution to the art.

I claim as may invention:

1. A method for separating micromechanical function elements on a semiconductor component, comprising the steps of:

manufacturing and wet-chemically etching free a micromechanical function element in an interior of the container;

for the wet-chemical etching, employing a liquid etching chemical which is bled from the container and admitting a liquid into the container as a rinsing agent;

bleeding downwardly the liquid admitted as a rinsing agent from the container and simultaneously admitting a liquid having a relatively lower density than the rinsing agent liquid into the container from above until the lower density liquid completely replaces the rinsing agent liquid;

completely converting the lower density liquid admitted into the container into a gaseous aggregate state by changing at least one of pressure and temperature in an interior of the container; and matching a pressure in the container to an outside air pressure and removing the etched component from the container.

2. A method according to claim 1 including the step of repeating as needed the step of bleeding the rinsing agent liquid from the container and admitting the lower density liquid into the container.

3. A method according to claim 1 including the step of providing the liquid as a rinsing agent with a lower density than the liquid etching chemical.

4. A method according to claim 1 including the step of admitting a deionized water as said rinsing agent liquid.

5. A method according to claim 1 including the step of providing said lower density liquid as ethanol.

6. A method according to claim 1 including the step of providing said lower density liquid admitted into the container as acetone.

7. A method according to claim 1 wherein the lower density liquid which is completely converted into the gaseous aggregate state comprises a chemical substance that can be sublimated from a solid aggregate state into said gaseous aggregate state due to a change in at least one of pressure and temperature; said chemical substance is converted into said solid aggregate state by at least by one of lowering the temperature and raising the pressure, and said solidified chemical substance being completely sublimated into said gaseous aggregate state by at least one of lowering the pressure prevailing in the container and raising the temperature in the container.

8. A method according to claim 1 including the step of employing liquid carbon dioxide as said lower density liquid.

9. A method according to claim 1 including the step of employing a liquid halogen compound as said lower density liquid.

10. A method according to claim 1 wherein said lower density liquid comprises a liquid fluorene compound.

11. A method according to claim 7 including the step of employing as said lower density liquid a liquid dichlorobenzene.

12. A method according to claim 7 wherein said lower density liquid comprises a liquid cyclohexane.

13. A method according to claim 7 including the step of employing a liquid alcohol as said lower density liquid.

14. A method according to claim 7 including the step of employing a liquid mixture of water with alcohol as said lower density liquid.

15. A method for separating micromechanical elements on a semiconductor component, comprising the steps of:

wet-chemically etching free a micromechanical element in an interior of the container;

for the wet-chemical etching, employing a liquid etching chemical which is bled from the container and admitting at the same time a liquid into the container as a rinsing agent, said liquid rinsing agent having a lower density than the liquid etching chemical;

bleeding downwardly the liquid admitted as a rinsing agent from the container while admitting a liquid having a relatively lower density than the rinsing agent liquid into the container from above until the lower density liquid replaces the rinsing agent liquid;

converting the lower density liquid admitted into the container into a gaseous aggregate state by changing at least one of pressure and temperature in an interior of the container; and matching a pressure in the container to an outside air pressure and removing the etched component from the container.

* * * * *